United States Patent
Mihalache et al.

(10) Patent No.: US 10,671,785 B1
(45) Date of Patent: Jun. 2, 2020

(54) FRAMEWORK FOR REUSING CORES IN SIMULATION

(71) Applicant: Xilinx, Inc., San Jose, CA (US)

(72) Inventors: Valeria Mihalache, Los Gatos, CA (US); Kumar Deepak, San Jose, CA (US); Saikat Bandyopadhyay, San Jose, CA (US); Sandeep S. Deshpande, Longmont, CO (US); Feng Cai, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 468 days.

(21) Appl. No.: 15/370,339

(22) Filed: Dec. 6, 2016

(51) Int. Cl.
*G06F 30/367* (2020.01)

(52) U.S. Cl.
CPC .................................. *G06F 30/367* (2020.01)

(58) Field of Classification Search
CPC ........................................ G06F 17/5022–5036
See application file for complete search history.

(56) References Cited

U.S. PATENT DOCUMENTS

| | | | | |
|---|---|---|---|---|
| 6,009,256 A * | 12/1999 | Tseng | .................. | G06F 17/5027 703/13 |
| 6,091,686 A * | 7/2000 | Caffarelli | ........... | G11B 7/00745 369/53.24 |
| 9,135,384 B1 * | 9/2015 | Santan | ................ | G06F 17/5036 |
| 2002/0035442 A1 * | 3/2002 | Dervisoglu | .... | G01R 31/318505 702/120 |
| 2004/0111252 A1 * | 6/2004 | Burgun | .............. | G01R 31/3183 703/28 |
| 2006/0015313 A1 * | 1/2006 | Wang | .................. | G06F 17/5027 703/14 |
| 2008/0127130 A1 * | 5/2008 | Carbone | ............... | G06F 17/505 717/140 |

* cited by examiner

*Primary Examiner* — Jack Chiang
*Assistant Examiner* — Aric Lin
(74) *Attorney, Agent, or Firm* — Kevin T. Cuenot

(57) ABSTRACT

Simulating a hardware description language design including a core and a testbench can include performing, using a processor, a first compilation of the hardware description language design by generating a compiled core unit for the core, a compiled testbench for the testbench, and synchronization data describing signals crossing a compile checkpoint boundary. A subsequent compilation of the hardware description language design can be performed by reusing the compiled core unit from the first compilation and generating a new compiled testbench for the testbench using the synchronization data.

20 Claims, 3 Drawing Sheets

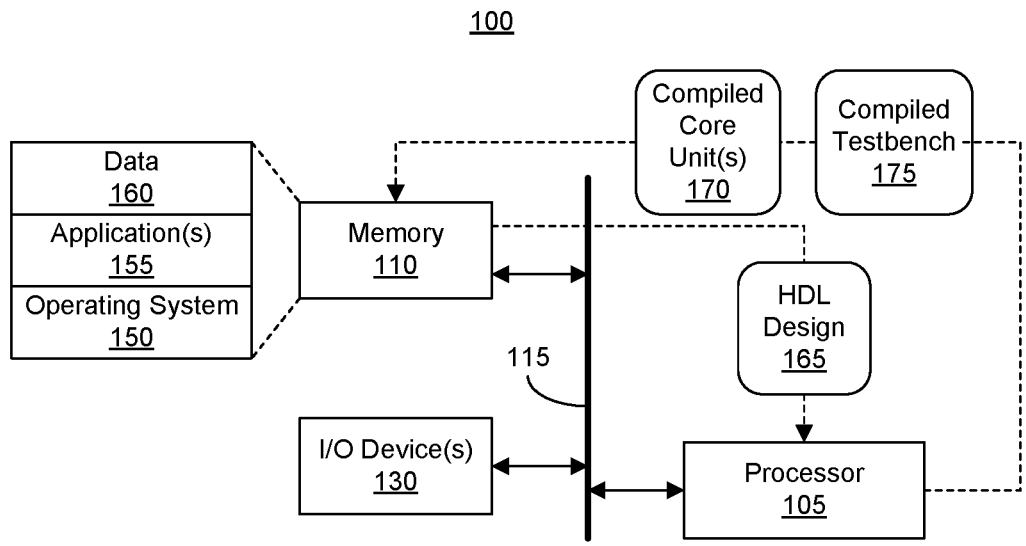
FIG. 1
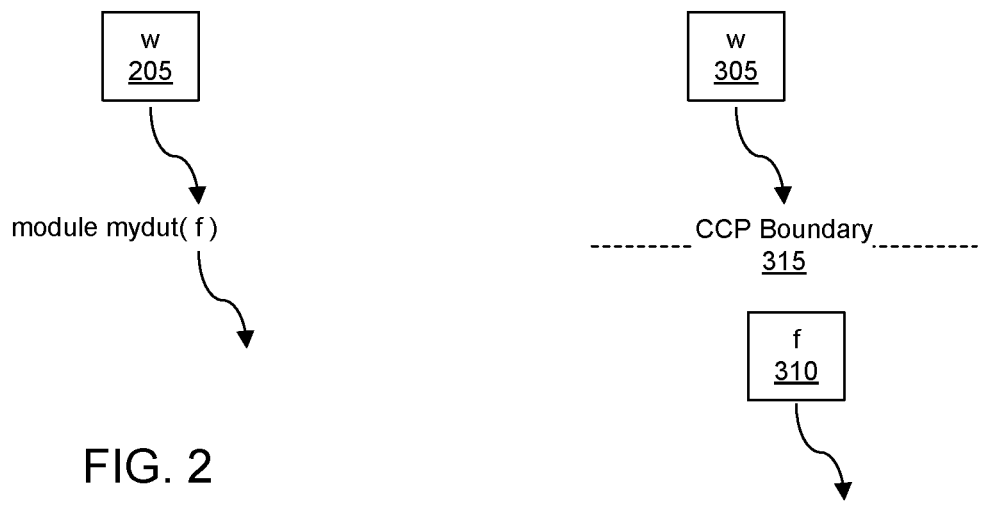
FIG. 2
FIG. 3

FRAMEWORK FOR REUSING CORES IN SIMULATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This disclosure relates to integrated circuits (ICs) and, more particularly, to reusing cores of a circuit design for simulation.

BACKGROUND

Modern integrated circuits (ICs) and/or circuit designs intended for implementation within an IC are often created using a hardware description language (HDL). An HDL is a computer-language that allows a designer to specify a digital system at a high level of abstraction. An HDL design is usually modular in nature. In many cases, an HDL design incorporates one or more Intellectual Properties or cores. The cores are connected together within the circuit design to function as a system. In the normal case, little time is spent designing a circuit design at the gate level.

Approximately half of the time available for system design may be devoted to HDL simulation. HDL simulation is a process that tests the functionality of an HDL design prior to implementation of that HDL design in an IC. HDL design generally includes a compile phase and a runtime phase. The compile phase elaborates the HDL design to generate executable models of the HDL design that are saved for later execution. The runtime phase executes the executable models in order to simulate the HDL design.

A typical HDL design process entails choosing the cores for inclusion in the HDL design, connecting the cores, building a testbench for testing, compiling the HDL design (which includes the testbench), and then running the HDL simulation. Any time that another core is added to the HDL design, one or more of the existing cores is changed, or the testbench is changed, the entire HDL design is compiled again. This process continues to iterate with the designer modifying the HDL design (including the testbench), compiling the entire HDL design, and performing the runtime phase for the compiled HDL design to determine whether established requirements are met.

Unfortunately, the compile phase is time consuming. The cores utilized in modern HDL designs are large in size and require significant computational resources, e.g., time and memory, to compile. Thus, significant time is spent in the design cycle waiting for the compile phase to complete in order to perform the runtime phase of HDL simulation.

SUMMARY

One or more embodiments are directed to methods of simulating a hardware description language (HDL) design. In one aspect, a method can include performing, using a processor, a first compilation of the HDL design by generating a compiled core unit for the core, a compiled testbench for the testbench, and synchronization data describing signals crossing a compile checkpoint boundary. Appreciably, the HDL design may include more than one core and, as such, more than one compiled core unit may be generated. The method can include performing, using the processor, a subsequent compilation of the HDL design by reusing the compiled core unit from the first compilation and generating a new compiled testbench for the testbench using the synchronization data.

One or more embodiments are directed to systems for simulating an HDL design. In one aspect, a system includes a processor configured to initiate executable operations. The executable operations can include performing a first compilation of the HDL design by generating a compiled core unit for the core, a compiled testbench for the testbench, and synchronization data describing signals crossing a compile checkpoint boundary. Appreciably, the HDL design may include more than one core and, as such, more than one compiled core unit may be generated. The executable operations can also include performing a subsequent compilation of the HDL design by reusing the compiled core unit from the first compilation and generating a new compiled testbench for the testbench using the synchronization data.

One or more embodiments are directed to computer program products. In one aspect, a computer program product can include a computer readable storage medium having program code stored thereon for simulating an HDL design including a core and a testbench. The program code is executable by a processor to cause the processor to perform a method. The method can include performing a first compilation of the HDL design by generating a compiled core unit for the core, a compiled testbench for the testbench, and synchronization data describing signals crossing a compile checkpoint boundary. Appreciably, the HDL design may include more than one core and, as such, more than one compiled core unit may be generated. The method can also include performing a subsequent compilation of the HDL design by reusing the compiled core unit from the first compilation and generating a new compiled testbench for the testbench using the synchronization data.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 1 illustrates an example data processing system.

FIG. 2 illustrates an example of a global net implementation.

FIG. 3 illustrates an example of an aggregate net implementation.

DETAILED DESCRIPTION OF THE DRAWINGS

Figure 4:
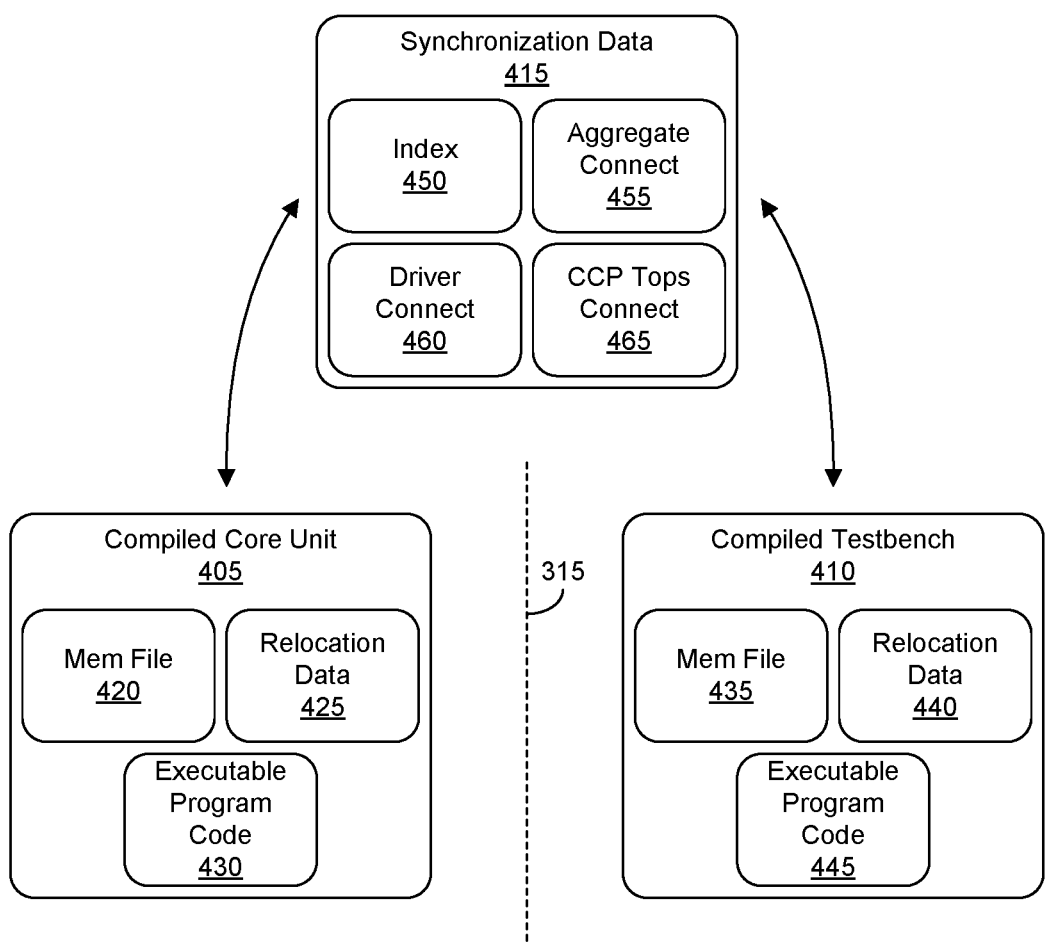
FIG. 4 illustrates example data structures generated during compilation for hardware description language (HDL) simulation.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to reusing cores of a circuit design for simulation. One or more embodiments described within this disclosure are directed to simulating a hardware description language (HDL) design by reusing cores. An asymmetrical approach is used where the system is capable of determining whether to compile and/or recompile cores on a per-core basis. Thus, not all HDL modules and/or files of the HDL design are treated in the same manner or are subject to processing in subsequent compilations. Cores may be compiled as part of the HDL simulation where the compiled data is saved for reuse thereby avoiding further time-consuming compile processes. As additional cores are added to the HDL design, the new cores may be identified as suitable elements for reuse for subsequent compilation phases without having to compile or recompile cores compiled during prior compilation phases.

Other systems determine whether to compile portions of the HDL design on a per module and/or a per file basis. Such systems, for example, track which files have changed during the design process and track dependencies among files to determine which files require recompilation. By processing changes to the HDL design on a per core basis as described herein, the administrative burden and computational resources needed to administer the processing is significantly reduced. This increases HDL simulation speed by, at least in part, reducing compilation time. For purposes of illustration, an HDL design may include approximately 10 cores that would require processing. Each core typically includes multiple HDL modules and spans multiple files. Thus, the same circuit design may have hundreds of modules and thousands of files that would require processing using conventional techniques compared to processing (or not) the 10 cores.

In one aspect, a core of an HDL design may be compiled during a first compile phase. The information that is generated for the core during the first compilation may be stored and used for purposes of the runtime phase of HDL simulation and reused for subsequent compilations of HDL simulation instead of having to recompile the core. As the HDL design evolves, core reuse for HDL simulation avoids having to compile the same cores multiple times thereby reducing the time required for performing the compilation phase of HDL simulation. The time savings grow larger as the HDL design continues to change requiring further HDL simulation.

One or more embodiments are directed to a method of simulating an HDL design by reusing cores for compilation purposes. One or more embodiments are directed to a system that is adapted to simulate an HDL design by reusing cores for compilation purposes. One or more embodiments are directed to a computer program product that includes a computer readable storage medium having program code stored thereon for simulating an HDL design that reuses cores for compilation purposes.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example data processing system (system) 100. As pictured, system 100 includes at least one processor 105 coupled to a memory 110 through interface circuitry 115. Interface circuitry 115 may be implemented as, for example, an input/output (I/O) subsystem, an I/O interface, a bus system, a memory interface, or other suitable circuitry. System 100 stores computer readable instructions (also referred to as "program code") within memory 110. Memory 110 may be considered an example of computer readable storage media. Processor 105 executes the program code accessed from memory 110 via interface circuitry 115.

Memory 110 includes one or more physical memory devices such as, for example, a local memory and one or more bulk storage devices. Local memory refers to random access memory (RAM) or other non-persistent memory device(s) generally used during actual execution of the program code. A bulk storage device may be implemented as a hard disk drive (HDD), solid state drive (SSD), or other persistent data storage device. System 100 may also include one or more cache memories (not shown) that provide temporary storage of at least some program code in order to reduce the number of times program code must be retrieved from the bulk storage device during execution.

System 100 may be coupled to one or more I/O devices 130 such as a keyboard, a display device, a pointing device, and/or one or more network adapters. A network adapter enables system 100 to become coupled to other systems, computer systems, remote printers, and/or remote storage devices. Examples of network adapters may include, but are not limited to, modems, Ethernet cards, bus adapters, connectors, wireless transceivers and/or radios, and so forth. System 100 may include one or more additional I/O device(s) beyond the examples provided. I/O devices 130 described herein may be coupled to system 100 either directly or through intervening I/O controllers.

As pictured, memory 110 may store an operating system 150, one or more application(s) 155, and data 160. Application 155, for example, may be an electronic design automation (EDA) application. In one or more embodiments, application 155 may be, or include, an HDL simulator. The term "HDL simulator" refers to any application that is capable of performing compilation and runtime for an HDL design. An example of an HDL simulator may include a High Level Modeling System (HLMS). In one aspect, operating system 150 and application 155, being implemented in the form of executable program code, are executed by system 100 and, more particularly, by processor 105, to perform the various operations described within this disclosure. As such, operating system 150 and application 155 may be considered an integrated part of system 100.

Operating system 150, application 155, and any data (e.g., data 160) used, generated, and/or operated upon by system 100 are functional data structures that impart functionality when employed as part of system 100 or when provided to an IC for implementation therein. As defined within this disclosure, a "data structure" is a physical implementation of the organization of the data of a data model within a physical memory. As such, a data structure is formed of specific electrical or magnetic structural elements in a memory. A data structure imposes physical organization on the data stored in the memory as used by an application program executed using a processor such as processor 105.

System 100 may include fewer components than shown or additional components not illustrated in FIG. 1 depending upon the particular type of device that is implemented. In addition, the particular operating system and/or application(s) included may vary according to device type as may the types of network adapter(s) included. Further, one or more of the illustrative components may be incorporated into, or otherwise form a portion of, another component. For example, a processor may include at least some memory.

In the example of FIG. 1, data 160 may include an HDL design 165. Processor 105 is capable of reading HDL design 165 from memory 110 and operating on HDL design 165 by performing an HDL simulation. HDL simulation includes a compile phase (referred to herein as "compilation") and a runtime phase (referred to herein as "runtime"). Processor 105, in performing at least compilation for HDL simulation, is configured to generate one or more compiled core units 170 and a compiled testbench 175 from HDL design 165.

In one or more embodiments, processor 105 performs compilation by generating one compiled core unit 170 for each core included within HDL design 165. Processor 105 generates one compiled testbench 175 from HDL design 165. Compiled core units 170 may be reused for further HDL simulations. For example, as the circuit design evolves, the cores of HDL design 165 need not be re-compiled. Rather, the compiled core unit(s) 170 may be reused. Processor 105 is configured to recompile the testbench portion of HDL design 165 to generate a new or different compiled testbench 175 that is used with the previously generated and reusable compiled core units 170 in subsequent runtime(s) of HDL simulation. In certain circumstances described herein in greater detail below, cores may be recompiled.

For example, in subsequent compilations, system 100 does not perform any further code generation for a core found in HDL design 165. As such, system 100 does not generate a new memory (mem) file for the core. In the subsequent compilations, system 100 reuses compiled core unit(s) 170, generates some compilation data relating to connections for the top HDL modules of the instantiated cores, and regenerates compiled testbench 175.

The term "core" refers to a pre-designed and reusable unit of logic, cell, or chip layout design in the field of electronic circuit design. A core, sometimes referred to as an "Intellectual Property Core" or "IP," is usually expressed as one or more files, e.g., data structures, describing hardware that performs a particular function. A core may be expressed using hardware description language file(s), as a netlist, as a bitstream that programs a programmable IC, or the like. A core may be used as a building block within an application-specific integrated circuit chip design or within a programmable IC circuit design. Examples of programmable IC circuit designs include circuit designs for implementation within field programmable gate arrays (FPGAs), ICs that include a processor in combination with programmable circuitry such as an FPGA, a system-on-chip, and so forth.

As new cores are added to HDL design 165, the system is capable of identifying the newly added cores and generating compiled core units 170 for each such newly added core. In one or more embodiments, cores utilized within HDL design 165 are stored within a library of cores. The library of cores may be stored within memory 110 of system 100 as part of data 160 or within another data storage device accessible to system 100. Because the cores are stored and obtained from the library, system 100 is able to differentiate between cores within HDL design 165 and the testbench for purposes of core reuse. The testbench is a user portion of the HDL design that is not obtained from the library of cores thereby allowing system 100 to differentiate cores from the testbench of HDL design 165.

While one or more embodiments described within this disclosure are directed to an HDL design having one top level module instantiating one core, it should be appreciated that the techniques described herein may be extrapolated to HDL designs having multiple top level modules and multiple instantiations of various cores.

In one or more embodiments, a system such as system 100 is capable of using the principle that declared wires and registers in HDL, whether VHDL, Verilog, System Verilog, etc., are owned by the particular design unit in which such structures are declared. The structures then flow through any child design unit instantiations. For purposes of illustration, the system creates or enforces a boundary between the cores and the testbench referred to as the Compile Check Point Boundary or CCP boundary. The CCP boundary may shift or move in different compilations in response to changes in HDL design 165 such as the addition of a core. The CCP boundary generally refers to the set of ports and/or nets that cross between the testbench and the cores at runtime.

System 100, in processing HDL design 165, is adapted to preserve the concept of global nets flowing throughout the testbench and throughout the cores. In the case where nets cross the CCP boundary via module instantiation, system 100 uses an aggregate net concept in order to separate the nets. The aggregate net structure allows the compiled core unit 170 to be maintained separately and independently of compiled testbench 175. Aggregate nets are described in greater detail with reference to U.S. Pat. No. 9,135,384 to Santan et al., which is incorporated herein by reference in its entirety. System 100 transforms formal ports of cores instantiated from the testbench into aggregate nets. Actual nets from the testbench that are connected to cores become the aggregate elements of aggregate nets.

Example 1 shows an example HDL design. Example 1 includes a first module called "tb" and a second module called "mydut."

EXAMPLE 1 module tb;
wire [7:0] w;
mydut dut (w);
assign w=8'b10101011;
endmodule
module mydut (f);
inout [7:0] f;
assign #3 f=8'b11111100;
endmodule For purposes of discussion, consider the case where the module "mydut" of Example 1 is part of the user's testbench, which includes the module "tb." In that case, system 100 compiles the HDL design using a representation that uses global nets. The global nets flow throughout the testbench and result in only the declared net "w" flowing through the instantiated module "dut." In compilation, the system uses one memory location for the net "w" that is also used for net "f" within the instantiated module "dut." At runtime of HDL simulation, because "w" and "f" use the same memory location, changes in the value of "w" triggered from module "tb" are automatically visible inside the instance of the module "mydut" as a change in the value for "f."

FIG. 2 illustrates an example of a global net representation. The global net representation uses a single memory location. As shown, memory location 205 for net "w" is also used to represent net "f" within instantiated module "dut."

Referring again to Example 1, where the module "mydut" is a top level module in a core and the module "tb" is part of the user testbench, system 100 is capable of generating two nets. In this case, a net declared in the testbench is used as an actual connected to a formal port of a core. Accordingly, system 100 is capable of using a different representation for the formal port of the core. A "formal" is an input, output, or inout port of a module instantiated in an HDL design. An "actual" is a signal passed to and from the formals during simulation runtime. Nets connect the formals to the actuals. One net is the declared net "w" and the other net is an aggregate net "f" that corresponds to the formal net of the module "dut." The compiled HDL design uses one memory location to represent declared net "w" and a second and different memory location to represent the aggregate net "f."

FIG. 3 illustrates an example of an aggregate net implementation. The aggregate net implementation uses different memory locations. As shown, memory location 305 is used to represent net "w" within module "tb." Memory location 310 is used to represent net "f" within instantiated module "dut." FIG. 3 further illustrates CCP boundary 315 discussed in connection with FIG. 1. The aggregate net data structure is utilized to create the CCP boundary 315 between the core and the testbench.

Using two different memory locations as illustrated in FIG. 3 and described above means that at runtime of HDL simulation, a value for "w" triggered from the module "tb" is not automatically visible inside the module "mydut" as a change in value for "f." System 100 is configured to implement processes during runtime of HDL simulation to ensure that "w" and "f" have the same value at all times in all delta cycles. Delta cycles are cycles at runtime where module processes dependent upon updated nets are scheduled and executed. At runtime, the system, in executing an HDL simulator, is configured to ensure that any changes to the value of "w" triggered from inside module "tb" are immediately propagated to "f." Similarly, the system is configured to ensure that any changes in the value of "f" triggered from inside module "mydut" are immediately propagated as a change to "w" inside module "tb."

FIG. 4 illustrates example data structures generated during compilation for HDL simulation. A system such as system 100 of FIG. 1 is capable of compiling HDL design 165 and generating compiled core unit 405, compiled testbench 415, and a synchronization data 415. Compiled core unit 405 is an example implementation of compiled core unit 170 of FIG. 1. Compiled testbench 410 is an example implementation of compiled testbench 175 of FIG. 1.

Though FIG. 4 is described using one core for purposes of illustration, it should be appreciated that the system is capable of generating a compiled core unit for each instance of a core of the HDL design. Each of the compiled core units would be located, or considered to be, on a same side of CCP boundary 315 as compiled core unit 405.

In one or more embodiments, the system performs a first compilation for HDL simulation. In the first compilation, the system generates one set of data for the core and another, separate set of data for the testbench from the HDL design. Thus, FIG. 4 illustrates compiled core unit 405, having a set of files that is separate from the set of files for compiled testbench 410. For purposes of illustration, CCP boundary 315 is shown between compiled core unit 405 and compiled testbench 410.

During a code generation phase of compilation, the system generates the executable program code for the core in a different file than the executable program code generated for the testbench. As shown, compiled core unit 410 includes executable program code 430, which includes one or more files. Compiled testbench 410 includes executable program code 445, which includes one or more files. In addition, during compilation the system writes a memory file (mem file) for the core and a separate mem file for the testbench. Thus, as pictured, compiled core unit 405 includes mem file 420. Compiled testbench 410 includes a mem file 435.

Executable program code 430 and executable program code 445 are the portions that are executed at runtime for HDL simulation. Executable program code 430 and 445, for example, model the functionality of the core and the testbench, respectively.

During compilation, the system further generates relocation data 425 for compiled core unit 410 and relocation data 440 for compiled testbench 410. Relocation data 425 may be implemented as one or more files. Relocation data 440 may be implemented as one or more files maintained separately from relocation data 425. Relocation data 425 and relocation data 440 each include one or more relocation instructions to be described herein in greater detail below.

During runtime of HDL simulation, data may cross CCP boundary 315 in several different ways. In one aspect, data crosses CCP boundary 315 through module instantiation of a core from the testbench. In another aspect, data crosses CCP boundary 315 through hierarchical referencing of a core signal from a testbench module. Data passed over CCP boundary 315 must be reconciled during subsequent compilations.

For example, during compilation, every formal port at CCP boundary 315 causes the system to create an aggregate element in the testbench that corresponds to the actual nets from the testbench that are connected to the formal ports at CCP boundary 315 by module instantiations. The data written in mem file 420 for the nets at CCP boundary 315, for example, has to be connected to the memory locations for the corresponding aggregate elements of compiled testbench 410 since any change in value for the formals at CCP boundary 315 has to be propagated to the corresponding aggregate elements, and vice-versa, as depicted in connection with FIG. 3.

Accordingly, in one or more embodiments, the system generates synchronization data 415 as part of compilation. Synchronization data 415 is used to reconcile data at CCP boundary 315. Synchronization data 415 includes an index 450, aggregate connect 455, driver connect 460, and CCP tops connect 465 for specifying data at CCP boundary 315. Each of index 450, aggregate connect 455, driver connect 460, and CCP tops connect 465 may be implemented as a file.

Since the memory addresses of the aggregate elements at CCP boundary 315 change in subsequent compilations, information about these memory addresses is not stored in mem file 420 as generated for the core. In one or more embodiments, the system generates aggregate connect 455 to store and maintain the relationships between aggregate nets of compiled core unit 405 at CCP boundary 315 and the corresponding aggregate elements of compiled testbench 410. The system is capable of storing associations, e.g., connections, of aggregate nets at CCP boundary 315 for formal ports in the top modules of the cores created in a first compilation with the aggregate elements created in subsequent compilations for the actual testbench nets connected to the formal ports of the cores. Further, the system stores the initial values of the aggregate nets at CCP boundary 315 within aggregate connect 455. The system may use the initial values stored in aggregate connect 455 to populate the initial values of the aggregate elements.

The system generates CCP tops connect 465 to store names and memory addresses of the top modules of the cores, e.g., of compiled core unit 405. During compilation, the system further stores names and addresses of data that resides within compiled core unit 405 within CCP tops connect 465. CCP tops connect 465 is referenced from within the testbench, e.g., from within compiled testbench 410.

The system generates driver connect 460 to store driver associations for drivers that operate across CCP boundary 315. Generation of drivers for the aggregate nets lead to the creation of aggregate element drivers. For the drivers of nets crossing CCP boundary 315, driver connect 460 stores the data necessary to reconcile data between aggregate net drivers and the corresponding aggregate element drivers.

The system generates index 450 to store and maintain addresses for the top modules of cores. Index 450 stores data for addresses of the ports of the top modules of cores and for the signals that reside within cores that are hierarchically referenced from within the testbench. The core signals in index 450 can be identified by name, location in the core source code, and/or instance number. Like aggregate connect 455 and driver connect 460, index 450 is generated in a first compilation, read in during any subsequent compilations, and used to create representations for the module instantiation statements that pertain to the top HDL modules of the instantiated core.

At runtime of HDL simulation after a second compilation, the system loads mem files 420 and 435. The system then reconciles the data within mem files 420 and 435 by executing one or more relocation instructions stored in relocation data 425 and relocation data 445. The relocation instructions are generated as part of compilation. Since the memory offsets written in executable program code 430 for compiled core unit 405 are relative to the global offsets of the HDL design and also relative to the size of mem file 435 of compiled testbench 410, the system executes the relocation instructions at the start of runtime to perform one or more memory relocations and/or shifts as necessary for mem file 420 and/or mem file 435.

When additional cores are instantiated from the testbench in subsequent compilations, the system updates index 450, aggregate connect 455, driver connect 460, and CCP tops connect 465 to specify data about the additional ports and hierarchical references from across the new CCP boundary as the ports and nets at CCP boundary 315 will be different. As noted, the system further generates a compiled core unit for each instance of a newly added core.

In one or more embodiments, once data is written to either mem file 420 or mem file 435, the system does not read data back from either mem file 420 or mem file 435 at the start of runtime since reading data from non-volatile memory such as a disk may hinder performance. Further, the system does not read from mem file 420 in subsequent compilations. Rather, compiled core unit 405 is regarded as a black box in subsequent compilations. The data describing interactions across CCP boundary 315 stored in synchronization data 415 is used in lieu of mem file 420 and/or executable program code 430. This treatment of compiled core unit 405 improves compile time performance and runtime performance of HDL simulation.

In one or more embodiments, during the first compilation, data for the compiled core is written in the core mem file 420, and relocation instructions for the compiled core are written in relocation data 425. Also, during the first compilation, data describing interactions across CCP boundary 315 is generated in the form of synchronization data 415.

In subsequent compilations, if the HDL code modeling the core has not changed, the system is capable of behaving as follows:

The data describing interactions across CCP boundary 315 stored in synchronization data 415 is used to generate data (e.g., mem file 435 and/or relocation data 440) and executable program code 445 inside compiled testbench 410. This compiled data and executable code corresponds to the module instantiations of the core. Compiled core unit 405 is regarded as a black box. This treatment of compiled core unit 405 improves compile time performance and overall performance of the HDL simulation.

The system does not read data from either mem file 420 or from relocation data 425 since reading data from non-volatile memory such as a disk may hinder performance. Mem file 420, for example, is usually rather large. Not having to read mem file 420 positively impacts performance of the system.

The system does not parse any further HDL code for the core. Therefore, the system does not generate any new data or any executable program code for the core. This too has a positive impact upon compile time performance since the HDL code modeling a core is usually rather large.

Figure 5:
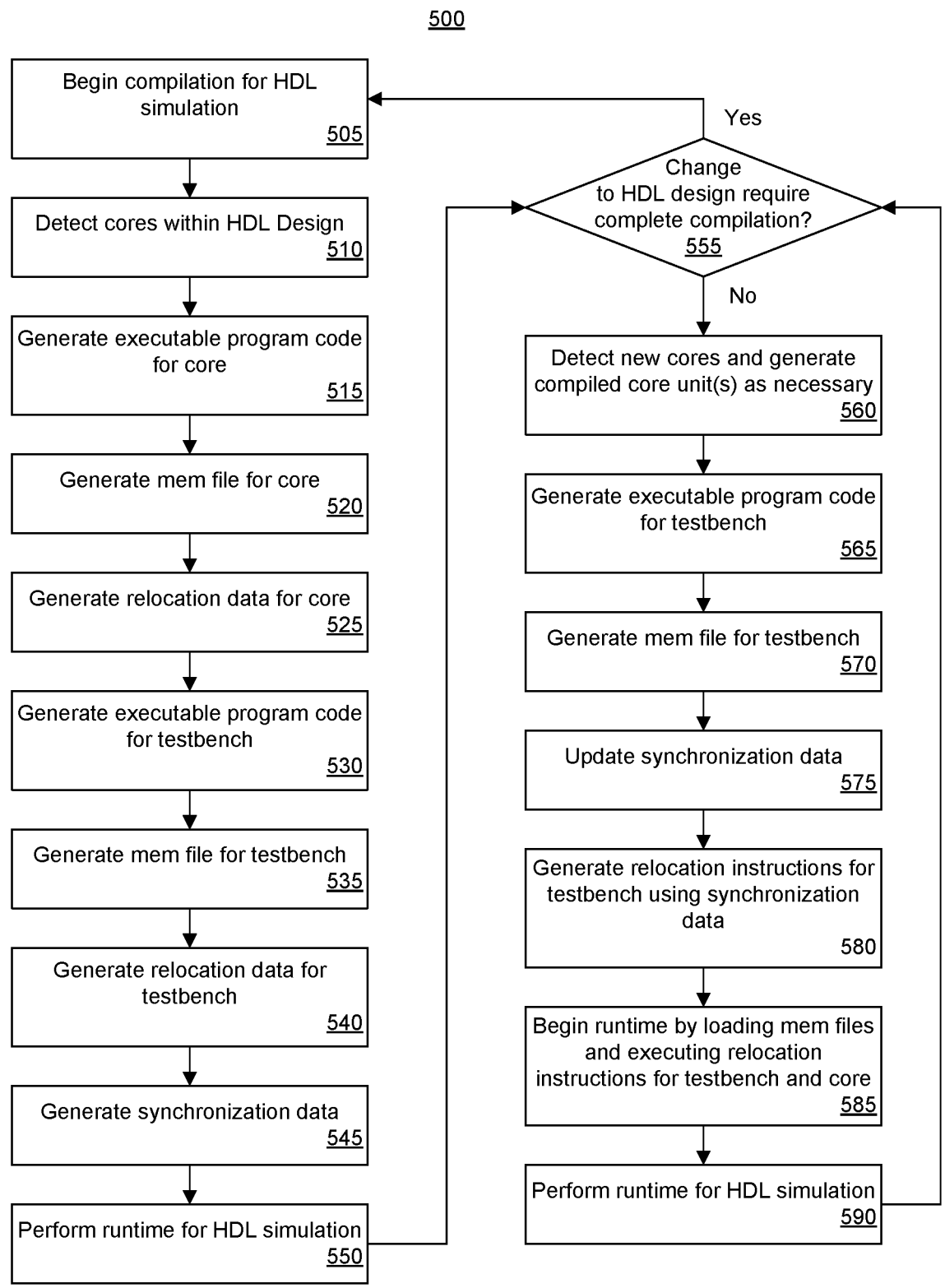
FIG. 5 illustrates an example method of performing HDL simulation.

FIG. 5 illustrates an example method 500 of performing HDL simulation. Method 500 may be implemented by a system as described with reference to FIG. 1. For purposes of illustration, method 500 is described using a single core. It should be appreciated, however, that the HDL design may include more than one core. As such, the inventive arrangements are not intended to be limited by the number of cores included in the HDL design. Method 500 may be performed automatically in that the user, e.g., a designer, is not required to identify the cores to the system that do not require recompilation.

Method 500 may begin in block 505 where the system begins compilation for HDL simulation. In block 505, the system begins a first compilation of an HDL design for HDL simulation. In block 510, as part of compilation, the system detects any cores within the HDL design. As discussed, the system is capable of distinguishing cores from the testbench since the cores are stored as part of a library of cores.

In block 515, the system generates executable program code for the core. In block 520, the system generates a mem file for the core. Mem file generation is described in greater detail in connection with the pseudo code of Example 2. In block 525, the system generates relocation data for the core.

In block 530, the system generates executable program code for the testbench. In block 535, the system generates a mem file for the testbench. In block 540, the system generates relocation data for the testbench.

In block 545 the system generates synchronization data. For example, the system generates files such as index 450, aggregate connect 455, driver connect 460, and CCP tops connect 465. The synchronization data includes the data necessary for the system to reconcile data crossing the CCP boundary.

In block 550, the system can perform runtime for HDL simulation. After performing runtime for HDL simulation, a designer may change one or more aspects of the HDL design and/or the testbench.

In block 555, the system determines whether a change to the HDL design requires compilation of the entire HDL design. If so, method 500 loops back to block 505 to perform compilation of the entire HDL design. If not, method 500 continues to block 560 where the compiled core unit generated for the core is reused. In that case, the system need not regenerate the executable program code for the core. The system need not regenerate the mem file for the core. The system need not regenerate the relocation data for the core.

In one or more embodiments, the system is configured to recompile the entire HDL design in response to the compiler version changing or in response to one or more compile options being changed. The compiler version and compile options may be persisted to memory for a given compilation and compared with current compiler version and compile options for subsequent compilations in order to detect change(s).

The system is also configured to recompile the entire HDL design in response to one or more parameters of modules of the core of a compiled core unit changing. The system is also configured to recompile the entire HDL design in response to one or more module instantiations from cores corresponding to the compiled core unit changing. The system is further configured to recompile the entire HDL design in response to determining that additional data from the core corresponding to the compiled core unit is being hierarchically referenced by one or more other compiled core units or the testbench.

Proceeding to block 560, the system is capable of detecting any newly added core(s) to the HDL design and generating compiled core unit(s) as necessary. In cases where the HDL design changes by adding one or more additional cores, compilation of the entire HDL design is not necessary. In that case, the system is capable of compiling the testbench and any cores added to the HDL design while reusing compiled core units from prior compilation(s).

In block 565, the system generates executable program code for the testbench. In block 570, the system generates the mem file for the testbench. In block 575, the system updates the synchronization data. In block 580, the system generates relocation instructions for the testbench using the synchronization data. As noted, relocation data for the core need not be regenerated.

It should be appreciated that in some cases, relocation instructions may specify memory locations and/or offsets using expressions that include variables. For the data at the CCP Boundary, the value(s) assigned to such variables may change through subsequent compilations. Accordingly, as relocation instructions are executed at runtime, a result of executing a relocation instruction affecting data inside the core may result in a different value than was obtained in executing the same relocation instruction for a prior runtime as a consequence of the value of the variable(s) changing. Such scenarios can be handled by placing the corresponding relocation instructions in the testbench relocation data 440.

In block 585, the system begins runtime by loading the mem files of the compiled core unit and the compiled testbench and executes the relocation instructions. In one aspect, the system executes relocation instructions for the compiled testbench and then executes relocation instructions for the compiled core unit. In block 590, the system performs runtime for the HDL simulation. In block 590, the system executes the executable program code for the testbench and/or the compiled core unit. The system, for example, may read the synchronization data and use the synchronization data to model connections between the testbench and the core.

As an illustrative example, when runtime of HDL simulation starts, data such as the mem files are loaded into memory in block 585. The system first loads the testbench mem file and then loads the core mem file. In general, the offsets of the core mem file need to be shifted based upon the size of the testbench mem file. For example, if the core mem file is to be loaded at an address of 1000 from a first compilation, but the size of the testbench mem file increases by 2000 after a second compilation, the system loads the core mem file at the address 1000+2000 which is 3000. The offset of the core mem file shifts with the size of the testbench mem file after each compilation.

After loading the core mem file, the system reads the relocation data in block 585 and executes the relocation instructions contained therein. The relocation instructions may include a variety of offset shifting, changing, or data reconciliation instructions. For example, a relocation instruction may specify that data at a particular offset needs to be copied to another offset because the memory locations are connected. A relocation instruction may indicate that the value at a particular offset needs to be changed because the size of the testbench mem file has changed.

For purposes of illustration and with reference to Example 1, consider an example where the core mem file indicates an offset for "f" of 1000 in a first compilation. The system may write data in the index of the synchronization data indicating that "w" is connected to a port at the CCP boundary that is called "f" and that "f" can be found at offset 1000 of the core mem file. In further compilations, from the index, the system knows that "f" is at offset 1000 of the core mem file and is to be connected with "w" despite not accessing or generating the core mem file or generating core executable program code.

The system further may write reconciliation instructions, e.g., a type or subset of relocation instructions, that the value computed for "w" is to be copied to the offset for "f." Accordingly, if "w" is written in the testbench mem file at offset 2000, the reconciliation instruction executed at the start of runtime for HDL simulation causes the system to copy the value from offset 2000 in the testbench mem file to offset 1000 in the core mem file. Once the reconciliation instructions generated during compilation are executed at the start of runtime, the mem files are synchronized. At that point, execution of the executable program code of the compiled core unit and the compiled testbench can start.

Example 2 is pseudo code illustrating a method used during compilation of the HDL design. The pseudo code of Example 2 illustrates operations performed by the system in performing compilation at least with respect to the core mem file and the testbench mem file. Example 2 illustrates that a memory representation of a data item is only written to the core mem file for the first compilation. For each other compilation performed where the entire HDL design is not being compiled, writing the data item to the core mem file is skipped so that the system does not generate the core mem file in subsequent compilations as described. Example 2 further illustrates how the system generates relocation instructions that are stored within the relocation data of the compiled core unit and the compiled testbench. The relocation instructions stored in the relocation data for the compiled core unit and the compiled testbench are executed upon the start of runtime of HDL simulation subsequent to the loading of the core mem file and the testbench mem file.

EXAMPLE 2

```
FOR EACH data item being an HDL net, a variable, a
  register, a scope, or a process that needs representation
  in the mem file:
IF the data item is inside the core data or is at the CCP
  boundary, THEN:
  IF this is the first compilation of the HDL design,
    THEN:
    Write the memory representation (mem_represen-
      tation) for the data item in the core mem file;
  END IF;
  IF the mem_representation includes an offset (off-
    set_TB) residing in the testbench mem file,
    THEN:
    Add relocation instruction to update offset_TB in
      testbench relocation data for subsequent com-
      pilations;
  END IF;
  IF mem_representation includes any value
    (value_from_TB) that is written in the testbench
    mem file, THEN:
    Add relocation instruction to update
      value_from_TB in testbench relocation data for
      subsequent compilations;
  END IF
  IF mem_representation includes any offset
    (offset_core) that is written in the core mem file,
    THEN:
    In first compilation, add in core relocation data
      instruction to shift offset_core written at this
      address with the value of the user testbench file
      size (UserTestbenchMemFileSize);
  END IF;
  IF the data item is at the CCP boundary, THEN:
    IF mem_representation for the data item includes
      any value (value_mix) that needs to be com-
      puted from both values written in the core mem
      file and the testbench mem file, THEN:
      In the first compilation, write, in the index, the
        corresponding values that reside in the core
        mem file;
      In subsequent compilations, read the corre-
        sponding values from the index and use the
        values, together with the values written in the
        testbench mem file, to compute value_mix;
      In the first compilation, add relocation instruc-
        tion to update value_mix in core relocation data
        for subsequent compilations;
    END IF;
  END IF;
END IF;
IF the data item is inside the testbench data, THEN:
  Write mem_representation for the data item in the
    testbench mem file;
  IF mem_representation for the data item includes
    any offset (offset_core) that is written in the core
    mem file, THEN:
    Add relocation instruction to shift offset_core
      written at this address with the value of UserT-
      estbenchMemFileSize to testbench relocation
      data;
  END IF;
  IF mem_representation for the data item includes
    any value value_mix that needs to be computed
    from both values written in the core mem file and
    in the testbench mem file, THEN:
    In the first compilation, write in the index the
      corresponding values that reside in the core
      mem file;
    In subsequent compilation, read the corresponding
      values from the index and use the correspond-
      ing values, together with the values written in
      the testbench mem file, to compute desired
      value_mix and write the value_mix in the tes-
      tbench mem file;
  END IF;
  IF mem_representation for the data item includes
    any value (value_TB) that needs to be updated in
    the core mem file, THEN:
    Save the value and corresponding referencing in a
      scratch pad (e.g., memory) for retrieval as
      needed during core mem file writing;
  END IF;
END IF;
END FOR EACH;
```

Example 3 shows a testbench portion of another example HDL design.

EXAMPLE 3

```
timescale 1 ns/1 ps
module tb;
wire [3:0] finalout;
wire [3:0] w;
assign #4 finalout=4'b1110;
counter UUT (. out({finalout[3:2], w[1:0]}));
initial
begin
  #7;
  $display("finalout is % b", finalout);
  if (finalout===4'b1×10)
    $display("TEST PASSED\n");
  else
    $display("TEST FAILED\n");
  $finish;
end
endmodule
```

Example 4 shows a core portion of the example HDL design illustrated in Example 3.

EXAMPLE 4

```
'timescale 1 ns/1 ps
module counter(out);
output [3:0] out;
assign #2 out=4'b1011;
endmodule
```

Referring to Example 3, module "tb" is the user's testbench. Module "counter" in Example 4 is the core. During compilation, the assignment "assign #4 finalout=results in one driver "d1" for the net "finalout." The assignment "assign #2 out=4'b10011;" results in a driver "d2" for the net "out." The net "out" is at the CCP boundary. Accordingly, the net "out" is represented as an aggregate net having the aggregate elements "finalout [3:2]" and "w[1:0]." This effects the driver "d2" of "out" having 2 corresponding aggregate element drivers which are a driver "d3" for "finalout" and a driver "d4" for "w."

Table 1 illustrates a view into the testbench mem file. The sizes of data written may vary depending upon the particular implementation of the HDL simulator.

TABLE 1

| Offset | Data Written in User Testbench Mem File | Size of Data Written |
|---|---|---|
| ... | ... | ... |
|  | Data written in user testbench mem file for net "finalout" |  |
| 640 | structure_for_declared_net_properties for net "finalout" | 136 |
| 776 | value for net "finalout" | 8 |
| 784 | projected_waveform for driver d1 of "finalout" | 80 |
| 864 | projected_waveform for driver d3 of "finalout" | 80 |
| 944 | multiple driver structure for "finalout" |  |
| ... | ... | ... |
| 1320 | structure_for_aggregate_net_element_properties for the aggregate element "w[1:0]" and "out" | 48 |
| 1368 | structure_for_aggregate_net_element_properties for the aggregate element "finalout[3:2]" of "out" | 48 |
| 1416 | offset of projected waveform for aggregate element driver "d3"; value = 864 | 8 |
| 1424 | offset of projected waveform for aggregate element driver "d4" | 8 |
| ... | ... | ... |

Table 2 illustrates a view into the core mem file. The sizes of data written may vary depending upon the particular implementation of the HDL simulator.

Table 2

| Offset | Data Written in User Core Mem File | Size of Data Written |
|---|---|---|
| ... | ... | ... |
|  | Data written in user core mem file for net "out" |  |
| 8 | structure_for_aggregate_net_properties for "out"; this includes number of aggregate elements, which is 2 and also offset in the testbench mem file where the aggregate elements will be written | 120 |
| 128 | value for "out" | 8 |
| ... | ... | ... |
| 368 | structure_for_driver_properties for driver "d2" of "out"; this includes reference to the offset in the testbench mem file where the projected waveform for the aggregate element drivers related to driver "d2" are written: extended_properties_offset = 1416-368 | 24 |
| 392 | value for driver "d2" of "out" | 8 |
| ... | ... | ... |

Referring to Table 1, the memory location at offset 1416 refers to the offset in memory where the projected waveform for the aggregate element driver d3 of the net "finalout" is stored. Accordingly, the value stored at offset 1416 is "864." As noted, driver d2 is related to driver d3. Thus, in the memory structure for driver properties for driver d2 in Table 2, a reference to the offset in the testbench mem file, where the projected waveform for driver d3 is written, is stored. The reference in Table 2 is modelled as a relative value to the memory location for d3 having value "1416-368" and is populated from executing relocation instructions from the testbench.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise. As defined herein, the term "another" means at least a second or more. As defined herein, the terms "at least one," "one or more," and "and/or," are open-ended expressions that are both conjunctive and disjunctive in operation unless explicitly stated otherwise. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. As defined herein, the term "automatically" means without user intervention.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. Memory elements, as described herein, are examples of a computer readable storage medium. A non-exhaustive list of more specific examples of a computer readable storage medium may include: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing.

As defined herein, the term "coupled" means connected, whether directly without any intervening elements or indirectly with one or more intervening elements, unless otherwise indicated. Two elements may be coupled mechanically, electrically, or communicatively linked through a communication channel, pathway, network, or system. As defined herein, the terms "includes," "including," "comprises," and/or "comprising," specify the presence of stated features, integers, steps, operations, elements, and/or components, but do not preclude the presence or addition of one or more other features, integers, steps, operations, elements, components, and/or groups thereof. As defined herein, the term "output" means storing in physical memory elements, e.g., devices, writing to display or other peripheral output device, sending or transmitting to another system, exporting, or the like. As defined herein, the term "plurality" means two or more than two.

As defined herein, the term "hardware description language" is a computer-language that facilitates the documentation, design, and manufacturing of a digital system, such as an integrated circuit. A hardware description language, or HDL, combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high level programming languages, an HDL also includes an explicit notion of time, which is a primary attribute of a digital system.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context. As defined herein, the term "responsive to" means responding or reacting readily to an action or event. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," or similar language mean that a particular feature, structure, or characteristic described in connection with the embodiment is included in at least one embodiment described within this disclosure. Thus, appearances of the phrases "in one embodiment," "in an embodiment," and similar language throughout this disclosure may, but do not necessarily, all refer to the same embodiment.

As defined herein, the term "processor" means at least one hardware circuit configured to carry out instructions contained in program code. The hardware circuit may be an integrated circuit. Examples of a processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, a graphics processing unit (GPU), a controller, and so forth.

As defined herein, the term "user" means a human being. The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

In an embodiment, a method of simulating an HDL design including a core and a testbench includes performing, using a processor, a first compilation of the HDL design by generating a compiled core unit for the core, a compiled testbench for the testbench, and synchronization data describing signals crossing a compile checkpoint boundary. The method can include performing, using the processor, a subsequent compilation of the HDL design by reusing the compiled core unit from the first compilation and generating a new compiled testbench for the testbench using the synchronization data.

In another aspect, reuse of compiled portions of the HDL design is performed on a per core basis.

In another aspect, files of the compiled core unit are separate from files of the compiled testbench.

In another aspect, the compiled core unit can include a core memory file, core relocation data, and core executable program code. The compiled testbench can include a testbench memory file, testbench relocation data, and testbench executable program code.

Performing the subsequent compilation can include generating relocation instructions for the compiled testbench. The relocation instructions can be generated using the synchronization data.

The method further can include, at runtime of an HDL simulation following the subsequent compilation, executing relocation instructions to update memory locations populated from the core memory file and the testbench memory file prior to executing the core executable program code or the testbench executable program code.

In another aspect, signals that cross the compile checkpoint boundary are represented using aggregate nets.

In an embodiment, a system for simulation of an HDL design including a core and a testbench can include a processor. The processor may be adapted to perform a first compilation of the HDL design by generating a compiled core unit for the core, a compiled testbench for the testbench, and synchronization data describing signals crossing a compile checkpoint boundary. The processor may be adapted to perform a subsequent compilation of the HDL design by reusing the compiled core unit from the first compilation and generating a new compiled testbench for the testbench using the synchronization data.

In an aspect, reuse of compiled portions of the HDL design can be performed on a per core basis.

In another aspect, the files of the compiled core unit can be separate from files of the compiled testbench.

In another aspect, the compiled core unit can include a core memory file, core relocation data, and core executable program code. The compiled testbench can include a testbench memory file, testbench relocation data, and testbench executable program code.

In another aspect, the subsequent compilation can be performed by generating relocation instructions for the compiled testbench.

In another aspect, the relocation instructions can be generated using the synchronization data.

The processor can be adapted to, at runtime of an HDL simulation following the subsequent compilation, execute relocation instructions to update memory locations populated from the core memory file and the testbench memory file prior to executing the core executable program code or the testbench executable program code.

In another aspect, signals that cross the compile checkpoint boundary can be represented using aggregate nets.

In another aspect, signals referenced in module instantiations within the testbench can use a shared memory location at runtime.

In another aspect, signals referenced in module instantiations within a core can use a shared memory location at runtime.

In another aspect, the subsequent compilation can be performed by reading the synchronization data and using the synchronization data to model connections between the testbench and the core.

Another embodiment can include a computer program product including a computer readable storage medium having program code stored thereon for simulating an HDL design including a core and a testbench. The program code can be executable by a processor to cause the processor to perform a method. The method can include performing a first compilation of the HDL design by generating a compiled core unit for the core, a compiled testbench for the testbench, and synchronization data describing signals crossing a compile checkpoint boundary. The method can include performing a subsequent compilation of the HDL design by reusing the compiled core unit from the first compilation and generating a new compiled testbench for the testbench using the synchronization data.

Other aspects of the computer program product may include further program code for performing any of the various operations described herein with reference to the method(s) and/or system(s).

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method of simulating a hardware description language design and a testbench, the method comprising:
    performing, using a processor, a first compilation of the hardware description language design by generating a first compiled core unit for a first core of the hardware description language design, a compiled testbench for the testbench, and synchronization data describing signals crossing a compile checkpoint boundary for simulation of the hardware description language design;
determining that an entirety of the hardware description language design does not require recompilation based on detecting that a second core has been added to the hardware description language design, that a same version of the compiler is used as was used to generate the first compiled core unit, and that a compile option of the compiler has not changed;
in response to the determining, performing, using the processor, a subsequent compilation of the hardware description language design by reusing the first compiled core unit from the first compilation, generating a second compiled core unit for the second core, and generating a new compiled testbench for the testbench using the synchronization data for further simulation of the hardware description language design;
wherein the first compiled core unit includes a core memory file, core relocation data, and core executable program code, and wherein the new compiled testbench comprises a testbench memory file, testbench relocation data, and testbench executable program code; and
wherein the performing the subsequent compilation comprises generating the new compiled testbench using the synchronization data in lieu of accessing the memory file of the first compiled core unit, and wherein the synchronization data specifies associations of aggregate nets at the compile checkpoint boundary for formal ports of top modules of the first compiled core unit with aggregate elements of the compiled testbench.

2. The method of claim 1, wherein the relocation data of the first compiled core unit includes relocation instructions specifying memory offset shifts for the first compiled core unit and data copy operations between connected memory locations; and
wherein the relocation instructions are generated based on a first set of rules corresponding to data items inside the core memory file or at the compile checkpoint boundary, and a second set of rules corresponding to data items inside the compiled testbench.

3. The method of claim 2, wherein the relocation instructions are executed at runtime and include variables such that the relocation instructions are reusable using updated values assigned to the variables for further compilations, wherein runtime simulates the hardware description language design through execution of the testbench executable program code and the core executable program code.

4. The method of claim 3, wherein the relocation instructions are generated using the synchronization data.

5. The method of claim 3, further comprising:
at runtime of a hardware description language simulation following the subsequent compilation, executing the relocation instructions to update memory locations populated from the core memory file and the testbench memory file prior to executing the core executable program code or the testbench executable program code.

6. The method of claim 1, wherein files of the first compiled core unit are separate from files of the compiled testbench.

7. The method of claim 1, further comprising:
updating the synchronization data to specify further data corresponding to additional ports and hierarchical references for the compile checkpoint boundary corresponding to the second core.

8. The method of claim 1, wherein signals that cross the compile checkpoint boundary are represented using aggregate nets.

9. A system, for simulation of a hardware description language design and a testbench, the system comprising:
a processor configured to initiate operations including:
performing a first compilation of the hardware description language design by generating a first compiled core unit for a first core of the hardware description language design, a compiled testbench for the testbench, and synchronization data describing signals crossing a compile checkpoint boundary for simulation of the hardware description language design;
determining that an entirety of the hardware description language design does not require recompilation based on detecting that a second core has been added to the hardware description language design, that a same version of the compiler is used as was used to generate the first compiled core unit, and that a compile option of the compiler has not changed;
in response to the determining, performing a subsequent compilation of the hardware description language design by reusing the first compiled core unit from the first compilation, generating a second compiled core unit for the second core, and generating a new compiled testbench for the testbench using the synchronization data for further simulation of the hardware description language design;
wherein the first compiled core unit includes a core memory file, core relocation data, and core executable program code, and wherein the new compiled testbench comprises a testbench memory file, testbench relocation data, and testbench executable program code; and
wherein the performing the subsequent compilation comprises generating the new compiled testbench using the synchronization data in lieu of accessing the memory file of the first compiled core unit, and wherein the synchronization data specifies associations of aggregate nets at the compile checkpoint boundary for formal ports of top modules of the first compiled core unit with aggregate elements of the compiled testbench.

10. The system of claim 9, wherein the relocation data of the first compiled core unit includes relocation instructions specifying memory offset shifts for the first compiled core unit and data copy operations between connected memory locations; and
wherein the relocation instructions are generated based on a first set of rules corresponding to data items inside the core memory file or at the compile checkpoint boundary, and a second set of rules corresponding to data items inside the compiled testbench.

11. The system of claim 10, wherein the relocation instructions are executed at runtime and include variables such that the relocation instructions are reusable using updated values assigned to the variables for further compilations, wherein runtime simulates the hardware description language design through execution of the testbench executable program code and the core executable program code.

12. The system of claim 11, wherein the relocation instructions are generated using the synchronization data.

13. The system of claim 11, wherein the processor is further configured to initiate operations including:
at runtime of a hardware description language simulation following the subsequent compilation, executing the relocation instructions to update memory locations populated from the core memory file and the testbench memory file prior to executing the core executable program code or the testbench executable program code.

14. The system of claim 9, wherein files of the first compiled core unit are separate from files of the compiled testbench.

15. The system of claim 9, further comprising:
updating the synchronization data to specify further data corresponding to additional ports and hierarchical references for the compile checkpoint boundary corresponding to the second core.

16. The system of claim 9, wherein signals that cross the compile checkpoint boundary are represented using aggregate nets.

17. The system of claim 9, wherein signals referenced in module instantiations within the testbench use a shared memory location at runtime.

18. The system of claim 9, wherein signals referenced in module instantiations within a core use a shared memory location at runtime.

19. The system of claim 9, wherein the subsequent compilation is performed by reading the synchronization data and using the synchronization data to model connections between the testbench and the core.

20. A computer program product comprising a computer readable storage medium having program code stored thereon for simulating a hardware description language design and a testbench, the program code executable by a processor to cause the processor to perform a method comprising:
performing a first compilation of the hardware description language design by generating a first compiled core unit for a first core of the hardware description language design, a compiled testbench for the testbench, and synchronization data describing signals crossing a compile checkpoint boundary for simulation of the hardware description language design;
determining that an entirety of the hardware description language design does not require recompilation based on detecting that a second core has been added to the hardware description language design, that a same version of the compiler is used as was used to generate the first compiled core unit, and that a compile option of the compiler has not changed;
in response to the determining, performing a subsequent compilation of the hardware description language design by reusing the first compiled core unit from the first compilation, generating a second compiled core unit for the second core, and generating a new compiled testbench for the testbench using the synchronization data for further simulation of the hardware description language design;
wherein the first compiled core unit includes a core memory file, core relocation data, and core executable program code, and wherein the new compiled testbench comprises a testbench memory file, testbench relocation data, and testbench executable program code; and
wherein the performing the subsequent compilation comprises generating the new compiled testbench using the synchronization data in lieu of accessing the memory file of the first compiled core unit, and wherein the synchronization data specifies associations of aggregate nets at the compile checkpoint boundary for formal ports of top modules of the first compiled core unit with aggregate elements of the compiled testbench.

* * * * *